(12) United States Patent
Nishimura

(10) Patent No.: US 9,905,652 B2
(45) Date of Patent: Feb. 27, 2018

(54) SEMICONDUCTOR DEVICE HAVING VARYING WIRING RESISTANCE

(71) Applicant: FUJI ELECTRIC CO., LTD., Kanagawa (JP)

(72) Inventor: Takeyoshi Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/420,104

(22) Filed: Jan. 31, 2017

(65) Prior Publication Data

US 2017/0271452 A1   Sep. 21, 2017

(30) Foreign Application Priority Data

Mar. 15, 2016   (JP) .................................. 2016-050780

(51) Int. Cl.
*H01L 29/10* (2006.01)
*H01L 29/78* (2006.01)
*H01L 29/06* (2006.01)

(52) U.S. Cl.
CPC ...... *H01L 29/1095* (2013.01); *H01L 29/0634* (2013.01); *H01L 29/0696* (2013.01); *H01L 29/7815* (2013.01); *H01L 2924/0002* (2013.01)

(58) Field of Classification Search
CPC ........... H01L 24/48; H01L 2224/45015; H01L 2224/4903; H01L 2224/49431; H01L 2224/49051
See application file for complete search history.

(56) References Cited

U.S. PATENT DOCUMENTS

| | | | | |
|---|---|---|---|---|
| 5,869,357 A | * | 2/1999 | Zambrano | H01L 21/76838 228/180.5 |
| 6,424,035 B1 | * | 7/2002 | Sapp | H01L 24/49 257/173 |
| 7,372,109 B2 | * | 5/2008 | Chen | H01L 27/0255 257/370 |
| 2005/0200009 A1 | * | 9/2005 | Kang | H01L 24/03 257/734 |
| 2006/0289915 A1 | * | 12/2006 | Omura | H01L 29/7815 257/296 |

(Continued)

FOREIGN PATENT DOCUMENTS

JP   2002-314079 A   10/2002
JP   2010-219258 A    9/2010

*Primary Examiner* — Ida M Soward

(57) ABSTRACT

In a conventional semiconductor chip, the source electrode and the sense pad electrode for current detection are provided separately and distanced from each other on the front surface of the semiconductor chip. The area occupied by the sense pad electrode must be several times the area of a MOSFET cell unit. Therefore, there is a problem that the area of the sense pad electrode is enlarged relative to the source electrode. Provided is a semiconductor device including a semiconductor substrate; a front surface electrode provided above the semiconductor substrate; a first wire for a first terminal connected to the front surface electrode; and a second wire for current sensing connected to the front surface electrode. A resistance of a path through which current flows through the second wire is higher than a resistance of a path through which the current flows through the first wire.

13 Claims, 13 Drawing Sheets

(56) References Cited

U.S. PATENT DOCUMENTS

| | | | |
|---|---|---|---|
| 2007/0085147 A1* | 4/2007 | Imoto | H01L 21/82389 |
| | | | 257/371 |
| 2011/0012195 A1 | 1/2011 | Momota et al. | |
| 2012/0007139 A1 | 1/2012 | Tanaka | |
| 2012/0112241 A1 | 5/2012 | Matsushita | |
| 2016/0118576 A1* | 4/2016 | Higo | H01L 43/08 |
| | | | 257/421 |
| 2016/0343711 A1* | 11/2016 | Kim | H01L 29/7816 |

* cited by examiner

SEMICONDUCTOR DEVICE HAVING VARYING WIRING RESISTANCE

BACKGROUND

1. Technical Field

The present invention relates to a semiconductor device.

2. Related Art

In a conventional semiconductor chip including a MOSFET (Metal-Oxide-Semiconductor Field Effect Transistor), a sense pad electrode for detecting current is provided, as shown in Patent Documents 1 and 2, for example.
Patent Document 1: Japanese Patent Application Publication No. 2002-314079
Patent Document 2: Japanese Patent Application Publication No. 2006-351985

In a conventional semiconductor chip, the source electrode and the sense pad electrode for current detection are provided separately at a distance from each other on the front surface of the semiconductor chip. In this case, it is necessary to set the area occupied by the sense pad electrode to be several times the area of a MOSFET cell unit. As result, there is a problem that the area of the sense pad electrode is enlarged relative to the source electrode, for example.

SUMMARY

According to a first aspect of the present invention, provided is a semiconductor device comprising a semiconductor substrate; a front surface electrode; a first wire for a first terminal; and a second wire for current sensing. The front surface electrode may be provided above the semiconductor substrate. The first wire for the first terminal may be connected to the front surface electrode. The second wire for current sensing may be connected to the front surface electrode. A resistance of a path through which current flows through the second wire may be higher than a resistance of a path through which the current flows through the first wire.

A diameter of the first wire may be greater than a diameter of the second wire.

A resistance per unit length of the first wire may be lower than a resistance per unit length of the second wire.

A first region of the front surface electrode connected to the first wire may have a greater area than a second region of the front surface electrode connected to the second wire.

A first region of the front surface electrode connected to the first wire may include a different material than a second region of the front surface electrode connected to the second wire.

A thickness of a second region of the front surface electrode connected to the second wire may be less than or equal to a thickness of a first region of the front surface electrode connected to the first wire, or a thickness of a second region of the front surface electrode connected to the second wire may be less than a thickness of a first region of the front surface electrode connected to the first wire.

The front surface electrode may include a connection region. The connection region may connect, in a first direction, a first region and a second region. The first region of the front surface electrode may be connected to the first wire. The second region of the front surface electrode may be connected to the second wire. A length of the connection region in a second direction orthogonal to the first direction may be less than a length of the second region in the second direction. The second direction may be orthogonal to the first direction.

The semiconductor device may further comprise a gate electrode. The gate electrode pad provided at a position differing from positions of the second region and the connection region in a direction parallel to the second direction. The gate electrode may be connected to a gate electrode of the semiconductor device.

The semiconductor device may further comprise a temperature sensing electrode pad. The temperature sensing electrode pad may be provided on an opposite side of the connection region and the second region from the gate electrode pad in the direction parallel to the second direction. The temperature sensing electrode pad may be used by a temperature sensing element for measuring temperature of the semiconductor device.

A resistance of the connection region may be greater than or equal to 10 times an ON resistance of the semiconductor device.

The semiconductor substrate may include a diode region below the connection region. The diode region that does not need to have one of a source region and an emitter region that are regions having low resistance for electrons.

A thickness of the connection region of the front surface electrode may be less than a thickness of the first region and less than a thickness of the second region.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
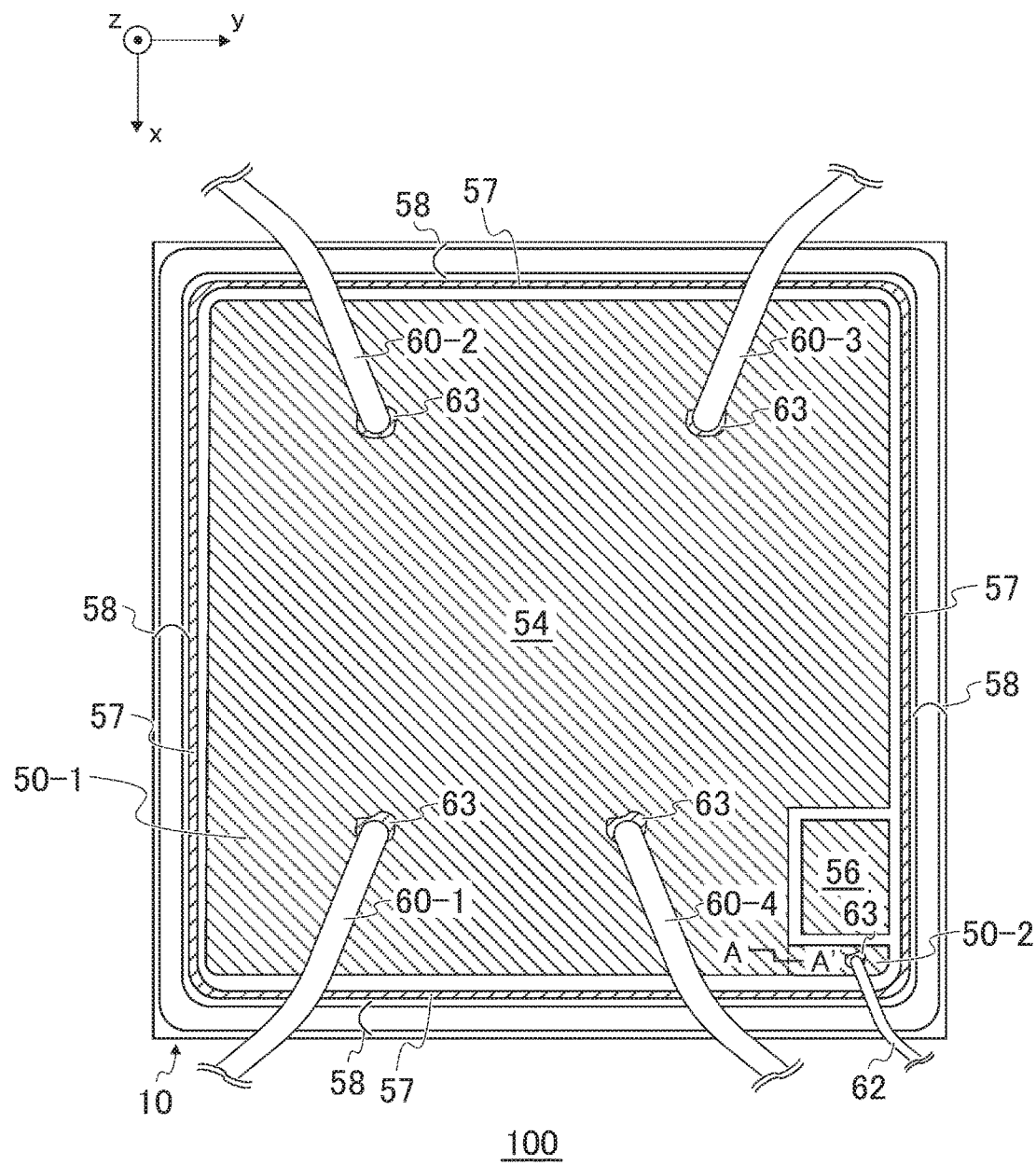
FIG. 1 shows a top surface of a semiconductor device 100 according to a first embodiment.

FIG. 1 shows a top surface of a semiconductor device 100 according to a first embodiment. In the present example, an x direction serving as a second direction and a y direction serving as a first direction are orthogonal to each other. A z direction is perpendicular to the x-y plane. The x direction, the y direction, and the z direction form a so-called right-handed system. In the present example, terms such as "top" and "above" refer to the +z direction, and terms such as "bottom" and "below" refer to the ×z direction.

The semiconductor device 100 in the present example includes at least a semiconductor substrate 10, a source electrode 54 serving as a front surface electrode, a source current wire 60 serving as a first wire, a sense current wire 62 serving as a second wire, a gate electrode pad 56, a gate runner 57, and a guard ring 58. The semiconductor device 100 in the present example includes a MOSFET as a switching element.

The source electrode 54 is provided above the semiconductor substrate 10. The source electrode 54 may be a metal film made of Al (aluminum) or an alloy including Al, or may be a layered film formed by layering a metal film made of Al or an alloy including Al on a barrier metal layer made of Ti (titanium) or the like.

The source electrode 54 in the present example includes a first region 50-1 connected to the source current wire 60 and a second region 50-2 connected to the sense current wire 62. In the present example, the boundary between the first region 50-1 and the second region 50-2 is shown by a dotted line. It should be noted that, in the present example, the first region 50-1 and the second region 50-2 are physically joined in the y direction, and there are no differences between the materials and structures thereof. Therefore, this boundary is merely a boundary used for convenient explanation. In the present example, the thickness of the first region 50-1 of the source electrode 54 and the thickness of the second region 50-2 of the source electrode 54 are the same.

The second region 50-2 in the present example is provided at a +x-direction end and a +y direction end of the source electrode 54. The second region 50-2 in the present example is a belt-shaped region that has a prescribed length in the x direction and in the y direction. In one example, in the case where Al is the main component in the wires, the x-direction width of the second region 50-2 is 60 [µm] and the y-direction width of the second region 50-2 is 120 [µm]. Furthermore, in a case where a metal other than Al, such as Cu (copper) or Au (gold), for example, is the main component in the wires, the x-direction width is 60 [µm] and the y-direction width is greater than or equal to 60 [µm].

The first region 50-1 in the present example has a greater area than the second region 50-2. The ratio between the area of the first region 50-1 and the area of the second region 50-2 is usually determined by the sense ratio, which is a ratio between the main current and the sense current. In a case where the area ratio determined by the sense ratio is from 100:1 to 100,000:1, the actual area ratio in the conventional art is from 50:1 to 1000:1 because a pad structure must be provided to separate the source electrode in the sensing section, while the actual area ratio in the present invention may be in a range from 80:1 to 10,000:1 because there is no need to provide the pad structure for separating the source electrode in the sensing section. In the present example, the ratio between the area of the first region 50-1 and the area of the second region 50-2 is approximately 150:1.

In the present example, four source current wires 60 are provided in the first region 50-1 and one sense current wire 62 is provided in the second region 50-2. The first region 50-1 and the second region 50-2 are respectively electrically connected to the source current wires 60 and the sense current wire 62 via solder 63. The diameter of the source current wire 60 may be greater than the diameter of the sense current wire 62. The diameter of each source current wire 60 may be greater than or equal to 100 [µm], and the diameter of the sense current wire 62 may be less than 100 [µm]. In the present example, the diameter of each source current wire 60 is 300 [µm] and the diameter of the sense current wire 62 is 50 [µm].

The source current wires 60 and the sense current wire 62 may be made of the same material or of different materials. These materials may be one wire or a combination of two or more wires whose main components are Al, Au, Ag (silver), and Cu. In the present example, the source current wires 60 and the sense current wire 62 both have Al as the main component. As the diameter becomes larger, the wire resistance decreases, and therefore the resistance per unit length of each source current wire 60 in the present example is lower than the resistance per unit length of the sense current wire 62.

Each source current wire 60 may have the same length as the sense current wire 62, or may be shorter than the sense current wire 62. In the present example, each source current wire has the same length as the sense current wire 62. By setting the lengths of the source current wires 60 to be less than the length of the sense current wire 62, it is possible to cause the resistance of the path through which current flows through one source current wire 60 to be lower than the resistance of the path through which current flows through one sense current wire 62.

In the present example, by adjusting one or more of the diameter, the material, and the length of each wire, the resistance of the path through which current flows through the sense current wire 62 is made higher than the resistance of the path through which the current flows through the source current wires 60. For example, the resistance of a path through which current flows through the sense current wire 62 is caused to be higher by at least two orders of magnitude compared to the resistance of the path through which current flows through the source current wires 60. In the present example, the resistance of the path through which current flows through the sense current wire 62 is 5 [Ω], and the resistance of the path through which current flows through the source current wires 60 is 50 [mΩ].

In the present example, the resistance of the path through which current flows through the source current wires 60 refers to the resistance in the source current wires 60 and the first region 50-1. In the present example where there are a plurality of source current wires 60, the resistance of the path through which current flows through the source current wires 60 refers to the resistance of the second region 50-2 and the composite resistance of the plurality of source current wires 60. Furthermore, in the present example, the resistance of the path through which current flows through the sense current wire 62 refers to the resistance in the sense current wire 62. The resistance of a lead frame or the like connecting the source current wires 60 and the sense current wire 62 is not included.

In order to set the resistance of the path through which current flows through the sense current wire 62 to be a prescribed resistance value, a resistor may be added separately from the wire in the path through which current flows through the sense current wire 62. For example, the diameter of each source current wire 60 and the diameter of the sense current wire 62 are made the same, and a resistor is added separately from the sense current wire 62. In this way, the resistance of the path through which current flows through the sense current wire 62 can be made higher than the resistance of the path through which current flows through the source current wires 60. In this case, the resistance of the path through which current flows through the sense current wire 62 refers to the composite resistance of the sense current wire 62 and the separately provided resistor.

There is a possibility that the current that has flowed through the MOSFET in the +z direction will flow to a region of the source electrode 54 with lower resistance in the x-y plane. In the present example, the resistance of the path through which current flows through sense current wire 62 is higher than the resistance of the path through which current flows through source current wires 60, and therefore it is difficult for current to flow from the first region 50-1 to the second region 50-2. In this way, the current flowing through the sense current wire 62, i.e. the sense current, can be made small compared to the current flowing through the source current wires 60, i.e. the main current.

Not all of the current that has reached the second region 50-2 within the current that has flowed through the MOSFET in the +z direction flows through the first region 50-1. For example, the current that has reached the second region 50-2 is limited from moving to the first region 50-1 by the sheet resistance of the source electrode 54. Therefore, the sense current flowing through the sense current wire 62 via the second region 50-2 is ensured. Specifically, the ratio between the main current and the sense current can be treated as being the ratio between the resistance of the path through which current flows through the source current wires 60 and the resistance of the path through which current flows through the sense current wire 62.

Accordingly, even when a sense pad electrode used for detecting current and distanced from the source electrode 54 such as in the conventional art is not provided, it is possible to realize a sense current. In the present example, the second region 50-2 that can function as a sense pad electrode does not need to have several times the area of a unit cell of the MOSFET. Therefore, compared to a case where the sense pad electrode distanced from the source electrode 54 is provided as in the conventional art, it is possible to make the second region 50-2 smaller. In particular, in the present example, it is possible to stabilize the ratio between the main current and the sense current, according to the ratio between the resistance of the path through which current flows through source current wires 60 and the resistance of the path through which current flows through the sense current wire 62. In this way, it is possible to sense the magnitude of the main current by using the sense current.

In addition, in the present example, the region (inactive region) of the MOSFET provided only to obtain the sense current and not provided to obtain the main current can be made smaller compared to a case where the sense pad electrode distanced from the source electrode 54 is provided as in the conventional art. When the inactive area is increased, the main current, i.e. the output characteristic, is reduced. Therefore, it is necessary to increase the chip size when the inactive area is increased. When the chip size is increased, the number of semiconductor chips that can be formed per wafer decreases, and therefore there is a problem that the manufacturing cost per semiconductor chip is increased. In contrast to this, with the present example, the inactive area can be reduced compared to a case where the sense pad electrode distanced from the source electrode 54 is provided as in the conventional art, and therefore it is possible to reduce the manufacturing cost.

Furthermore, in an example where the sense pad electrode distanced from the source electrode 54 is provided as in the conventional art, the MOSFET below the sense pad electrode is usually surrounded in the x-y plane by an edge termination structure or a distancing structure using a $p^+$-type impurity region. In a case where the MOSFET includes a super junction structure, there is a possibility that the charge balance of the p-type and n-type impurities will degrade due to the edge termination structure or distancing structure provided near the region under the sense pad electrode. As a result, there is a concern that fluctuation of characteristics, such as a drop in the breakdown voltage, will occur. In contrast to this, in the present example, one or more edge termination structures and distancing structures are provided to surround not only the second region 50-2, but to surround the entire first region 50-1 and second region 50-2, and therefore the present example has an advantage that characteristic fluctuation, such as a drop in the breakdown voltage, does not occur.

The present example, which constricts the sense current relative to the main current using the difference in resistance between paths, functions effectively when the ON resistance of the MOSFET is relatively low. For example, the present example is effective when the ON resistance of the MOSFET is several [mΩ]. In the present example, the ON resistance of the MOSFET is 3 [mΩ]. However, when the ON resistance of the MOSFET is several [Ω], it is difficult to adjust the ratio between the main current and the sense current even when the resistance ratio between the paths is adjusted.

It is obvious that the present example is not limited to a MOSFET, and may also be applied to an IGBT (Insulated Gate Bipolar Transistor). In an IGBT, the drift later enters a low resistance state due to modulation of the conductivity. Then, when a voltage becomes greater than or equal to a prescribed ON voltage [V], current flows between the collector electrode and the emitter electrode. When the ON voltage of the IGBT is approximately 1.5 [V], it is possible to adjust the ratio between the main current and the sense current by adjusting the resistance ratio between the paths, as in the present example.

In the present example, it is possible to preset the ratio between the main current and the sense current to be a predetermined ratio, according to the ratio between the resistance of the path through which current flows through the sense current wire 62 and the resistance of the path through which current flows through the source current wires 60. This preset ratio may be in a range from 100:1 to 100,000:1. It is possible to calculate the main current by measuring the sense current that is relatively small relative to the main current and multiplying this sense current by the preset ratio.

The source electrode 54 in the present example includes a notched portion at a y-direction end thereof. The notched portion in the present example is positioned between the first region 50-1 and the second region 50-2 in the x direction. The gate electrode pad 56 is provided in the notched portion in the present example. A gate wire may be provided on the gate electrode pad 56. A gate potential may be input to the gate electrode pad 56 from outside the semiconductor device 100, via the gate wire.

The gate runner 57 in the present example surrounds the first region 50-1, the second region 50-2, and the gate electrode pad 56. The gate runner 57 in the present example is electrically connected to the gate electrode pad 56 and the gate electrode 34 described further below. The gate runner 57 in the present example supplies the gate potential that is supplied to the gate electrode pad 56 to the gate electrode 34 of the MOSFET provided on the semiconductor substrate 10. The material of the gate electrode 34 and the gate runner 57 may be polysilicon (poly-Si).

There has been a trend of the large current amount conducted by a semiconductor device increasing in recent years. Along with this, in order to improve the operating efficiency of the semiconductor device and prevent breakdown of the semiconductor device, there is a demand for the detection of the main current. In the present example, the magnitude of the main current is detected using the sense current, and the voltage applied to the gate electrode pad 56 is reduced. Therefore, the main current is cut off or restricted.

The guard ring 58 in the present example surrounds the gate runner 57. The guard ring 58 may include a plurality of impurity regions having ring shapes that resemble each other. The guard ring 58 may have impurities whose polarity is opposite that of the semiconductor substrate 10. The guard ring 58 in the present example has p-type impurities, while the semiconductor substrate 10 is $n^-$-type. The guard ring 58 has a function to cause the depletion layer to expand to the end of the semiconductor substrate 10. In other words, the guard ring 58 functions as an edge termination structure. In this way, compared to a case where the guard ring 58 is not included, it is possible to improve the breakdown voltage of the semiconductor device 100. It is clear that, aside from the guard ring 58, a field plate is also effective for improving the breakdown voltage, and so a field plate may be used. If a field plate is used, it is also possible to use the gate runner 57 as the field plate.

Figure 2:
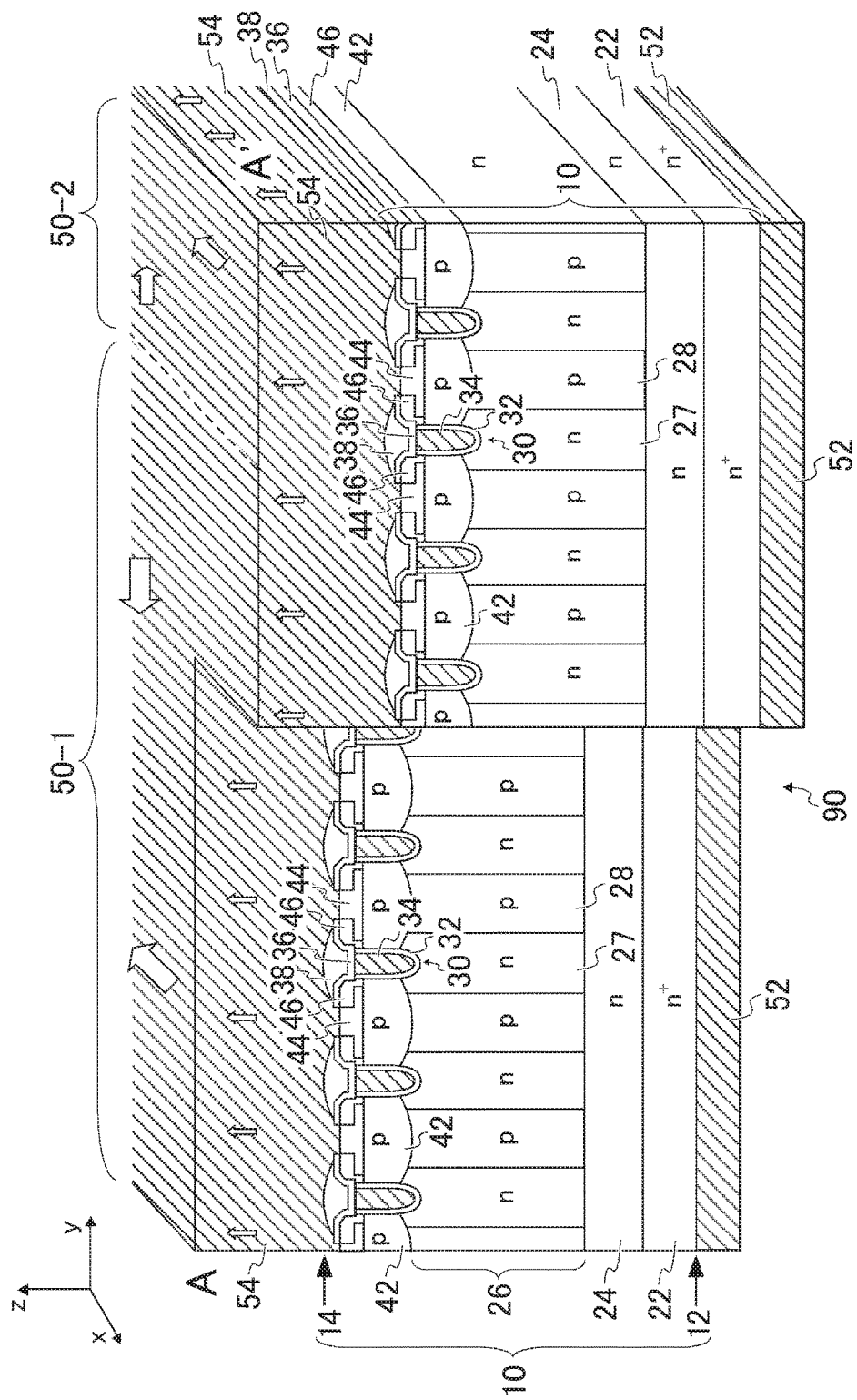
FIG. 2 shows the A-A' cross section from FIG. 1.

FIG. 2 shows the A-A' cross section from FIG. 1. FIG. 2 shows a detailed configuration of a MOSFET 90 in the semiconductor device 100. The semiconductor substrate 10 in the present example includes the region from an $n^+$-type layer 22 to a second interlayer insulating film 38. The semiconductor substrate 10 of the present example has a front surface 14 facing the +z direction and a back surface 12 facing the −z direction. In the present example, the front surface 14 is mainly formed by a contact region 44 and the second interlayer insulating film 38. The source electrode 54 is positioned on the front surface 14, and the drain electrode 52 is positioned under the back surface 12.

In the present example, "n" and "p" refer respectively to the majority of carriers being electrons and the majority of carriers being holes. Furthermore, the "+" and "−" signs written to the upper right of "n" and "p" respectively mean that the carrier concentration is higher than in a case where a "+" sign is not written and that the carrier concentration is lower than in a case where a "−" sign is not written. In the present example, the base region 42 is p-type, but the base region 42 may be n-type in another example. The impurity polarities of other structures can be determined as desired by someone skilled in the art. In the present example, E indicates 10 raised to a certain power, such that 1E+16 means $1\times10^{16}$, for example.

In the present example where the semiconductor layers and semiconductor regions are SiC, the n-type impurities may be one or more types of elements from among N (nitrogen) and P (phosphorous), and the p-type impurities may be one or more types of elements from among Al and B (boron). In contrast, in another example where the semiconductor layers and semiconductor regions are GaN, the n-type impurities may be one or more types of elements from among Si (silicon), Ge (germanium), S (sulfur), and O (oxygen). Furthermore, the p-type impurities may be one or more types of elements from among Mg (magnesium), Ca (calcium), Be (beryllium), and Zn (zinc).

The MOSFET 90 includes the $n^+$-type layer 22, an n-type layer 24, a column layer 26, a trench portion 30, a base region 42, a contact region 44, a source region 46, a first interlayer insulating film 36, the second interlayer insulating film 38, the drain electrode 52, and the source electrode 54. Although FIG. 2 does not show the entire structure in consideration of ease of viewing the drawing, the entire structure is clear to someone skilled in the art based on the portion of reference numerals shown.

In the first region 50-1 and the second region 50-2 in the present example, a unit structure for forming the MOSFET 90 is repeatedly provided in the y direction. Furthermore, each unit structure is provided to extend a predetermined length in the x direction. In this way, a plurality of unit structures repeatedly provided in the y direction form one cell in the MOSFET 90. The MOSFET 90 includes a plurality of cells. In the first region 50-1 and the second region 50-2 in the present example, the unit structures of the MOSFET 90 are identical. Therefore, the current output characteristics are the same in the first region 50-1 and the second region 50-2.

The $n^+$-type layer 22 is provided on the drain electrode 52. The $n^+$-type layer 22 may be a seed crystal substrate of a semiconductor substrate 10 including SiC. The n-type layer 24 is epitaxially grown and positioned on the $n^+$-type layer 22. The column layer 26 is positioned on the n-type layer 24. The column layer 26 in the present example has a structure in which n-type columns 27 and p-type columns 28 repeat in the y direction. The trench portions 30 may be positioned on the n-type columns 27, and the base regions 42 may be positioned on the p-type columns 28.

Each trench portion 30 includes a gate electrode 34 and a gate insulating film 32. The side portions of the gate insulating film 32 in the present example contact the base region 42, and the bottom portion of the gate insulating film 32 contacts the n-type column 27. The gate electrode 34 contacts the gate insulating film 32.

In the present example, the $p^+$-type contact regions 44 and the $n^+$-type source regions 46 are positioned on the p-type base regions 42. The source regions 46 contact the gate insulating films 32. Each pair of source regions 46 sandwich a contact region 44 in the y direction.

The first interlayer insulating film 36 is provided in a manner to cover the tops of the trench portions 30 and portions of the source regions 46. The second interlayer insulating film 38 is positioned on the first interlayer insulating film 36 and is thicker than the first interlayer insulating film 36. The first interlayer insulating film 36 and the second interlayer insulating film 38 may be $SiO_2$ (silicon dioxide). The source electrode 54 is positioned on the first interlayer insulating film 36 and the second interlayer insulating film 38. The source electrode 54 is electrically connected to the contact regions 44 and the source regions 46 through openings in the first interlayer insulating film 36 and the second interlayer insulating film 38.

When a prescribed potential is applied to the gate electrode 34, charge inversion regions occur in the base regions 42. The charge inversion regions function as channel regions through which the electrons move. If there is a prescribed potential difference between the source electrode 54 and the drain electrode 52, when the prescribed potential is applied to the gate electrode 34, current flows from the drain electrode 52 to the source electrode 54 through the $n^+$-type layer 22, the n-type layer 24, the n-type columns 27, the channel regions, and the source regions 46.

As described above, the resistance of the path through which current flows through the sense current wire 62 is higher than the resistance of the path through which current flows through the source current wires 60, and therefore the current reaching the first region 50-1 flows to the source current wires 60. In contrast, the current that reaches the second region 50-2 flows to the sense current wire 62. FIG. 2 shows the magnitude and orientation of the current using arrows. When the size of the arrow is greater, the current amount is greater.

Figure 3:
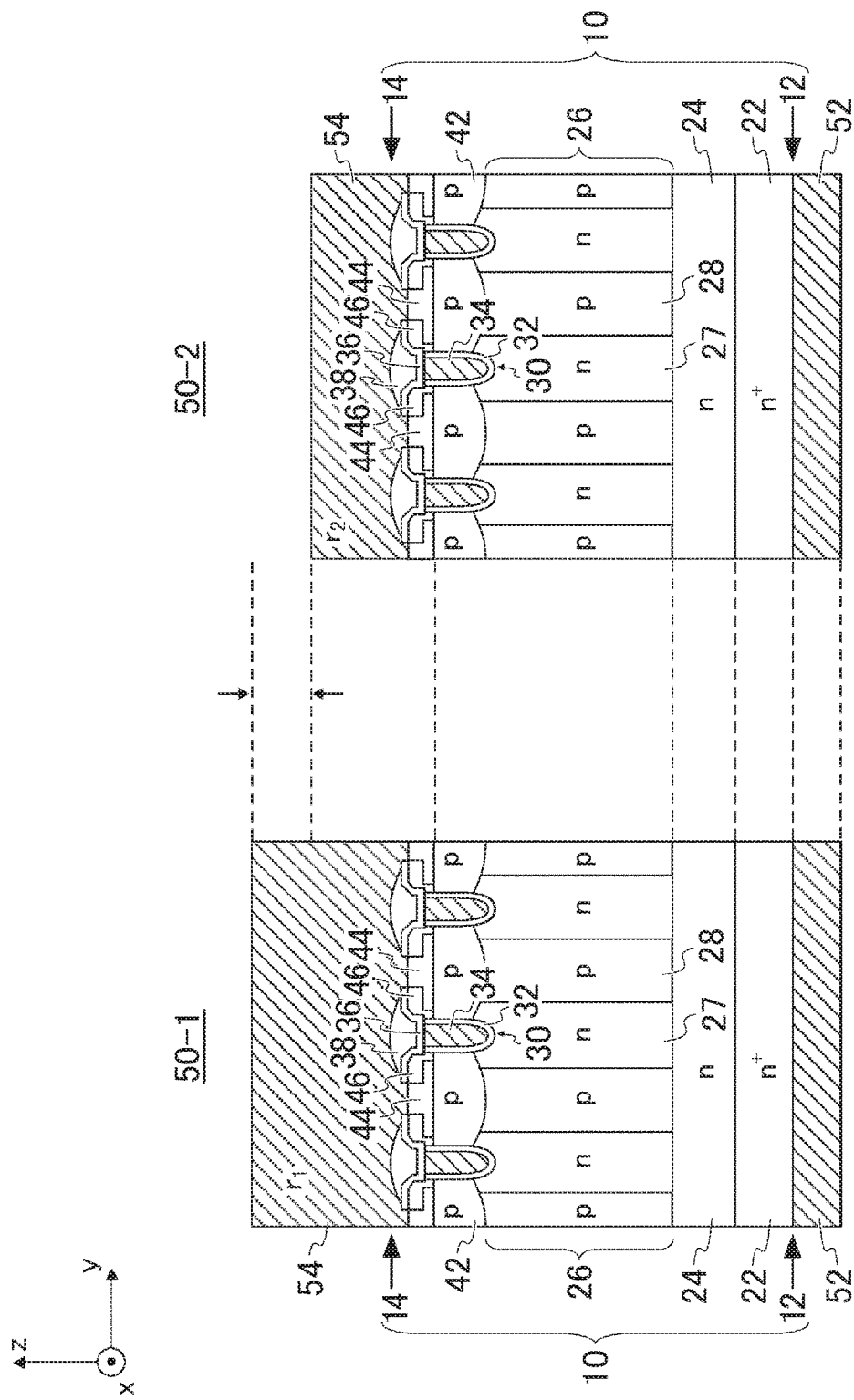
FIG. 3 shows the source electrode 54 according to a second embodiment.

FIG. 3 shows the source electrode 54 according to a second embodiment. In the present example, the thickness of the second region 50-2 of the source electrode 54 is less than the thickness of the first region 50-1 of the source electrode 54. Therefore, in the present example, it is possible to mainly adjust the ratio between the resistances of the paths according to the sheet resistance. The first region 50-1 and the second region 50-2 include the same material. Furthermore, the thicknesses refer to the length of the source electrode 54 in the z direction.

In the present example, the sheet resistance $r_2$ of the source electrode 54 in the second region 50-2 is higher than the sheet resistance $r_1$ of the source electrode 54 in the first region 50-1. As a result, the resistance of the path through which current flows through the sense current wire 62 can be made higher than the resistance of the path through which current flows through the source current wires 60.

In the present example, in order to change the thickness of a portion of the source electrode 54, metal film deposition may be performed twice in the first region 50-1 and metal film deposition may be performed once in the second region 50-2. The thickness of the metal layered in each single instance of deposition may be substantially equal. Instead, in order to change the thickness of a portion of the source electrode 54, metal film deposition may be performed in both the first region 50-1 and the second region 50-2, and then etching-back may be performed only in the second region 50-2.

In the present example, an example of the source current wires 60 and the sense current wire 62 of the first embodiment may be adopted. In the present example, the resistance of the path through which current flows through the sense current wire 62 can be made higher than the resistance of the path through which current flows through the source current wires 60 by adjusting one or more of the diameter, the material, and the length of each wire and also the sheet resistances of the first region 50-1 and the second region 50-2. In this way, it is possible to limit the current flowing through the sense current wire 62 and improve the sensing accuracy of the sense current.

As a first modification of the second embodiment, the first region 50-1 may include different material than the second region 50-2. As one example, in the first region 50-1, the source electrode 54 may be formed by Ti and Al or an alloy including Al layered on the Ti. In contrast, in the second region 50-2, the source electrode 54 may be formed by only Ti. Ti has a resistance rate greater than that of Al or an alloy including Al by one order of magnitude. In addition to the difference in material, the sheet resistance may be adjusted by adjusting the thickness of the second region 50-2. The source electrode of the second region 50-2 may be formed by layering a plurality of layers of Ti/TiN or the like.

Figure 4:
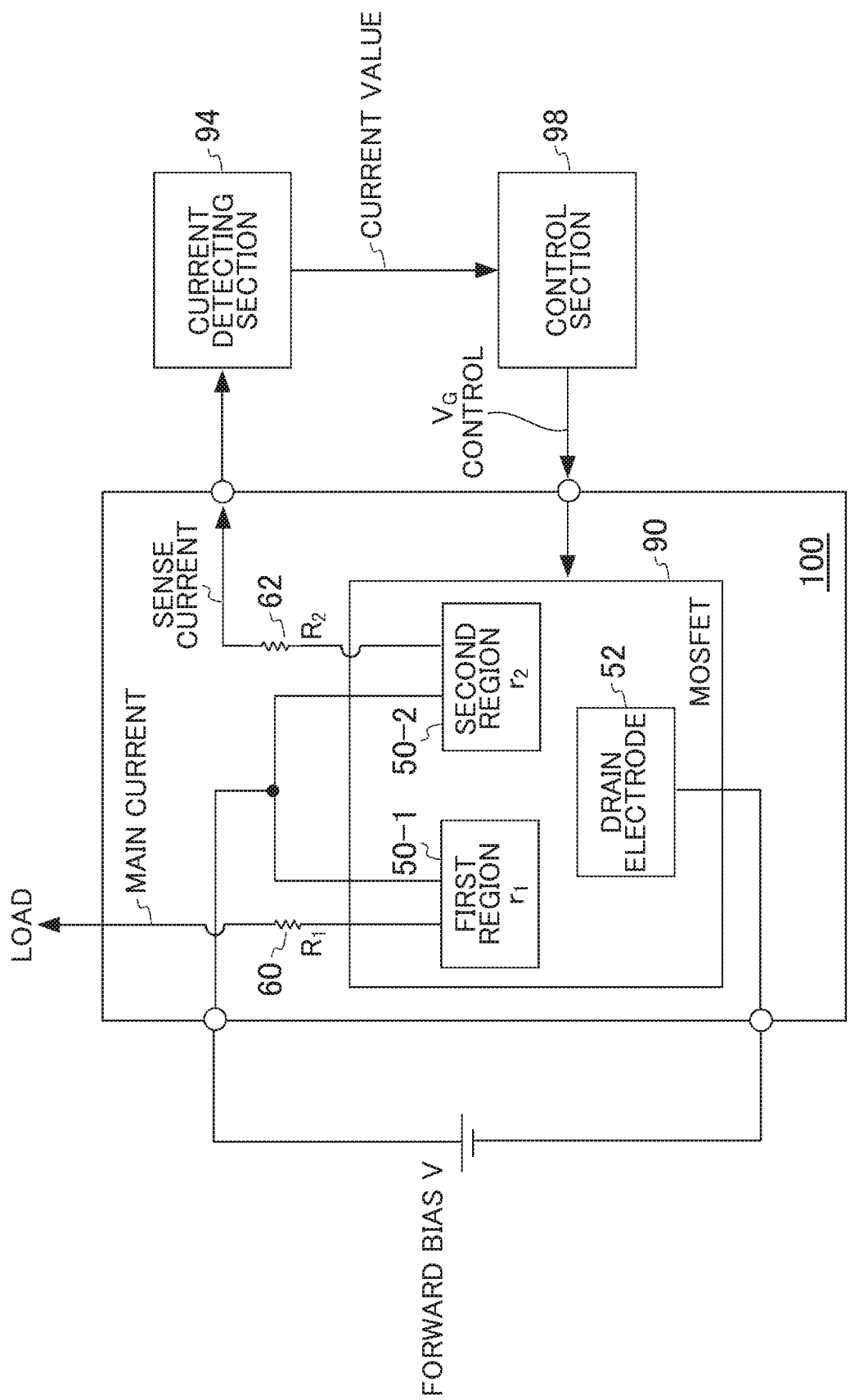
FIG. 4 is a drawing for describing a current control mechanism.

FIG. 4 is a drawing for describing a current control mechanism. FIG. 4 describes an example using the MOSFET 90 of the second embodiment. In this MOSFET 90, the first region 50-1 has a sheet resistance $r_1$, the second region 50-2 has a sheet resistance $r_2$, the source current wires 60 have a composite resistance $R_1$, and the sense current wire 62 has a resistance $R_2$. In the present example, $R_1$ is less than or equal to $R_2$ and $r_1$ is less than $r_2$.

In the present example, a forward bias V is applied between the drain electrode 52 and the first region 50-1 and second region 50-2. A load is electrically connected to tips of the source current wires 60. A current detecting section 94 is electrically connected to the tip of the sense current wire 62.

The current detecting section 94 measures the current flowing through the current detecting section 94 from the sense current wire 62. The current detecting section 94 notifies the control section 98 concerning the measured current value. The control section 98 receive the notification concerning the current value and controls the gate potential ($V_G$) applied to the gate electrode 34 of the MOSFET 90.

Specifically, when the current value measured by the current detecting section 94 is higher than a prescribed value, the control section 98 may decrease the main current by lowering the gate potential. In contrast, when the current value measured by the current detecting section 94 is lower than a prescribed value, the control section 98 may increase the main current by raising the gate potential. In this way, the control section 98 can control the main current of the MOSFET 90.

For example, by controlling the gate potential, the control section 98 can control the semiconductor device 100 such that the current flowing through the MOSFET 90 does not exceed the rated current. In this way, breakdown of the semiconductor device 100 can be prevented. It is obvious that the current control mechanism of the present example may be applied to the first embodiment.

Figure 5:
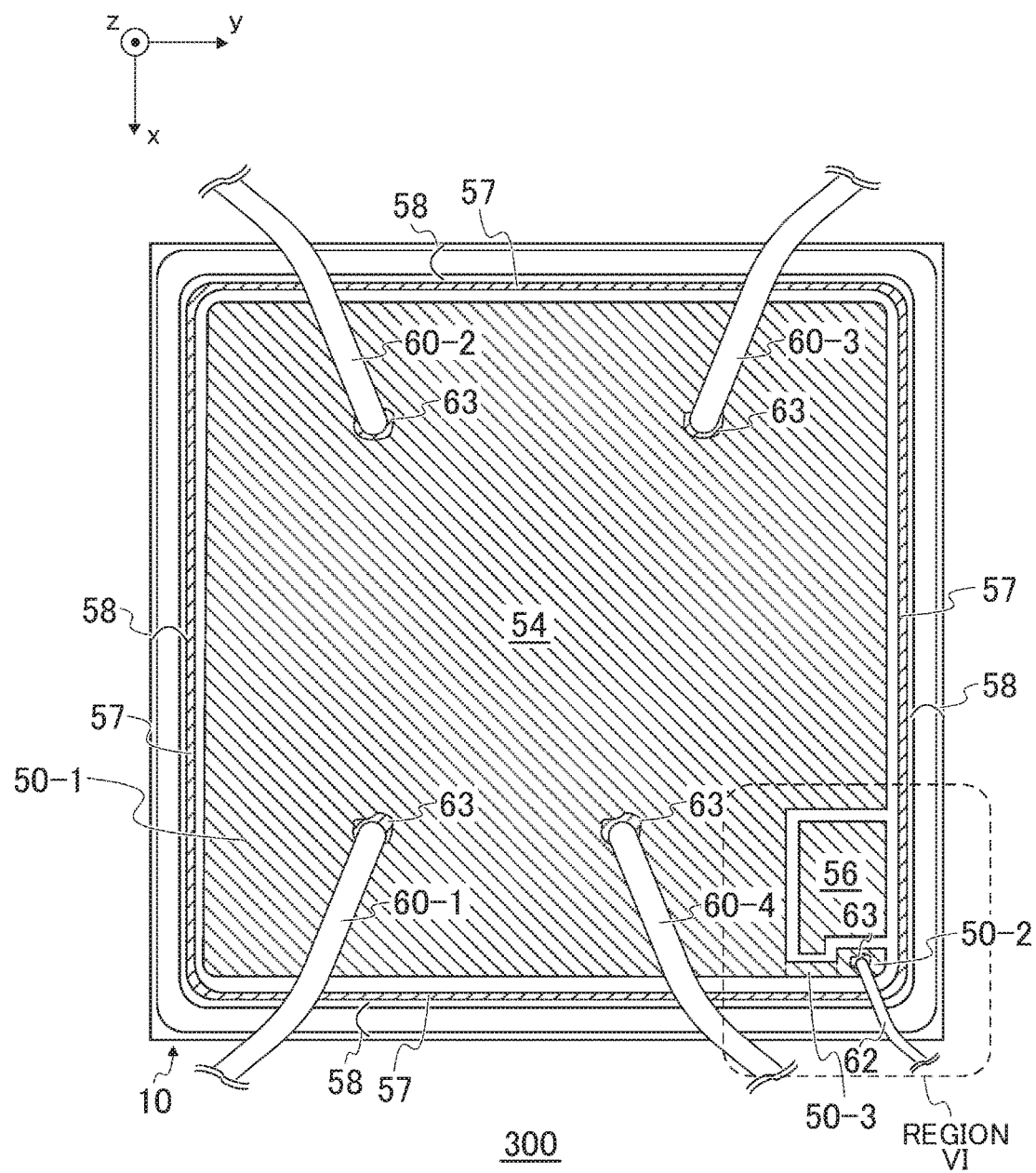
FIG. 5 shows a top surface of a semiconductor device 300 according to a third embodiment.

FIG. 5 shows a top surface of a semiconductor device 300 according to a third embodiment. The source electrode 54 in the present example includes a connection region 50-3. The connection region 50-3 is positioned between the first region 50-1 and the second region 50-2. The connection region 50-3 connects the first region 50-1 and the second region 50-2 in the y direction. In the present example, the length of the connection region 50-3 in the y direction is 10 [μm]. The length of the connection region 50-3 in the x direction is less than the length of the second region 50-2 in the x direction.

The resistance of the connection region 50-3 may be greater than or equal to 10 times the ON resistance of the MOSFET 90 in the semiconductor device 100. In the present example, the ON resistance of the MOSFET 90 is 3 [mΩ], which is the same as in the first embodiment. Therefore, the resistance of the connection region 50-3 in the present example is greater than or equal to 30 [mΩ]. The sheet resistance of the connection region 50-3 in the present example in the x-z plane is 30 [mΩ]. Therefore, it is possible to restrict current from flowing from the first region 50-1 to the second region 50-2.

The gate electrode pad 56 in the present example is provided at a position differing from the positions of the second region 50-2 and the connection region 50-3 in a direction parallel to the x direction. The gate electrode pad 56 in the present example includes a region that protrudes in the +x direction, according to the shapes of the connection region 50-3 and the second region 50-2. The third embodiment differs from the first and second embodiments with regard to including the connection region 50-3. Other points in the third embodiment may be the same as in the first or second embodiment.

Figure 6:
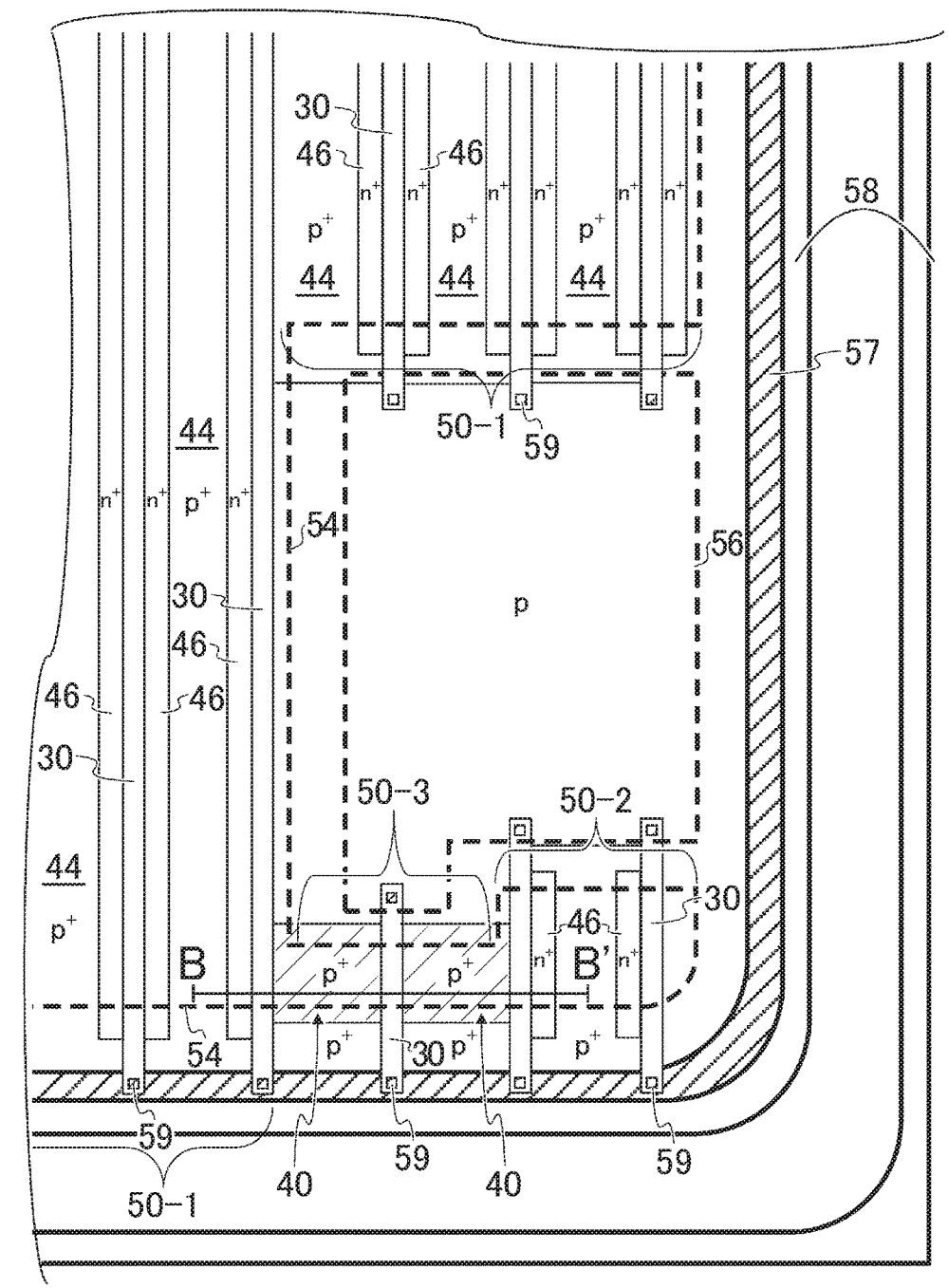
FIG. 6 shows an enlarged view of the region VI in FIG. 5 according to a first modification of the third embodiment.

FIG. 6 shows an enlarged view of the region VI in FIG. 5 according to a first modification of the third embodiment. In consideration of making the drawing easy to view, the source current wires 60 and the sense current wire 62 are not shown. In FIG. 6, the source electrode 54 and the gate electrode pad 56 are shown by dotted lines. Furthermore, the $p^+$-type contact regions 44 and the $n^+$-type source regions 46 positioned below the source electrode 54 and the gate electrode pad 56 are shown by solid lines. In FIG. 6, the p+-type region below the source electrode 54 is the contact region 44, but another p-type region may function as the separating region. Furthermore, the gate electrode pad 56 and the p-type region therebelow are electrically separated from each other by an insulating film.

The semiconductor substrate 10 in the present example includes a diode region 40 below the connection region 50-3. In FIG. 6, the diode region 40 is shown by hashing with diagonal lines. The diode region 40 is a region that does not include the source regions 46, which are regions that have low resistance for electrons. The diode region 40 includes a pn diode formed by the p+-type contact regions 44 and p-type base regions 42 and the n-type columns 27.

Since the diode region 40 in the present example does not include any source regions 46, even when a potential that is greater than or equal to the gate threshold voltage is applied to the gate electrode 34, current does not flow between the source and the drain in the diode region 40. In other words, for a current flowing in the +z direction in the MOSFET 90, the diode region 40 has a higher resistance than the MOSFET 90 below the first region 50-1 and the second region 50-2.

The semiconductor device 300 in the present example includes contact portions 59 that connect to the gate electrode pad 56 or the gate runner 57 at the +x-direction and −x-direction ends of the trench portions 30. The gate potential is supplied to the gate electrode 34 from the gate electrode pad 56 through these contact portions 59. The present example differs from the third embodiment with regard to including the connection region 50-3 and the diode region 40. Other points in the present example may be the same as in the third embodiment.

Figure 7A:
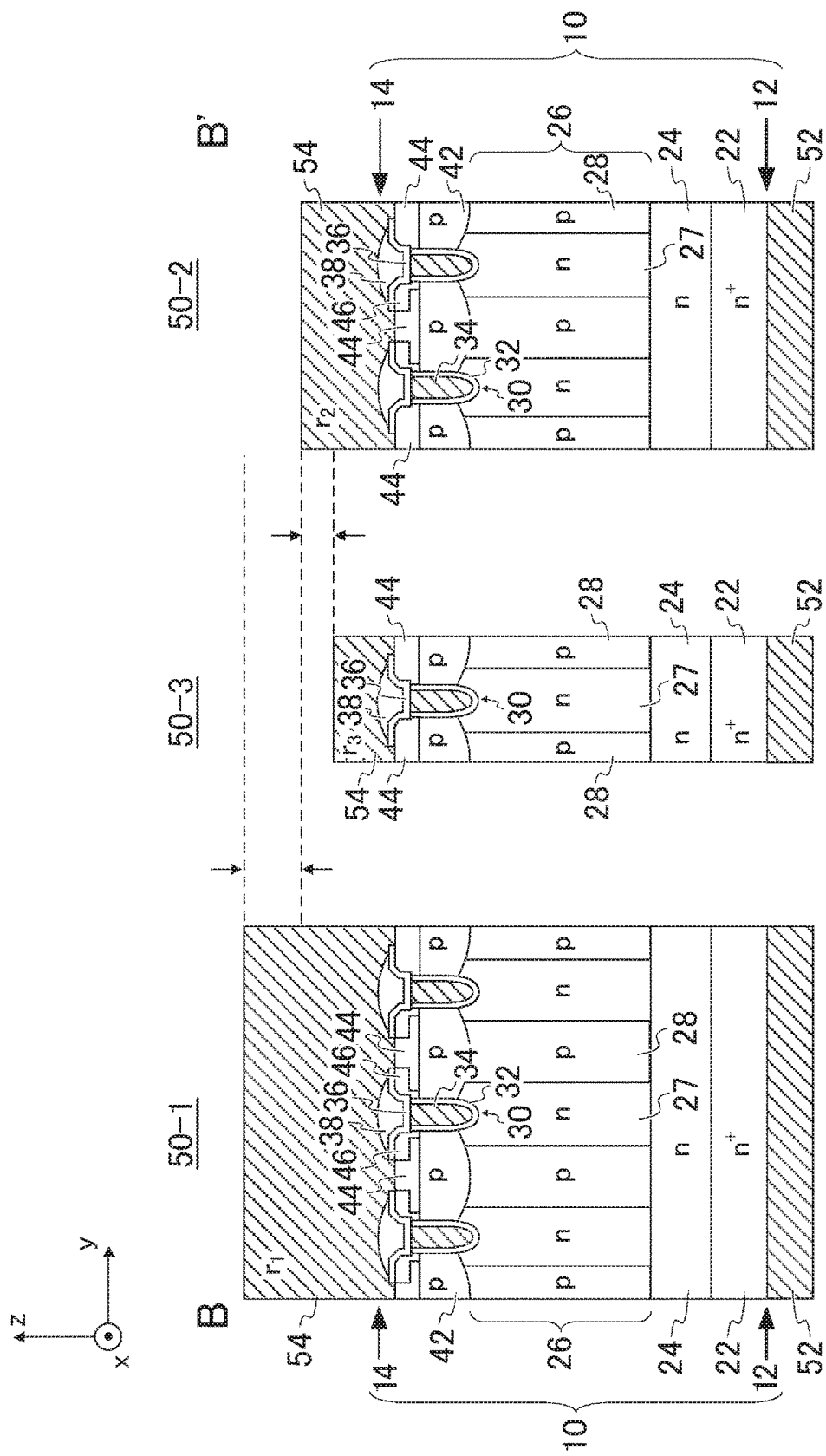
FIG. 7A shows the B-B' cross section from FIG. 6 according to a second modification of the third embodiment.
Figure 7B:
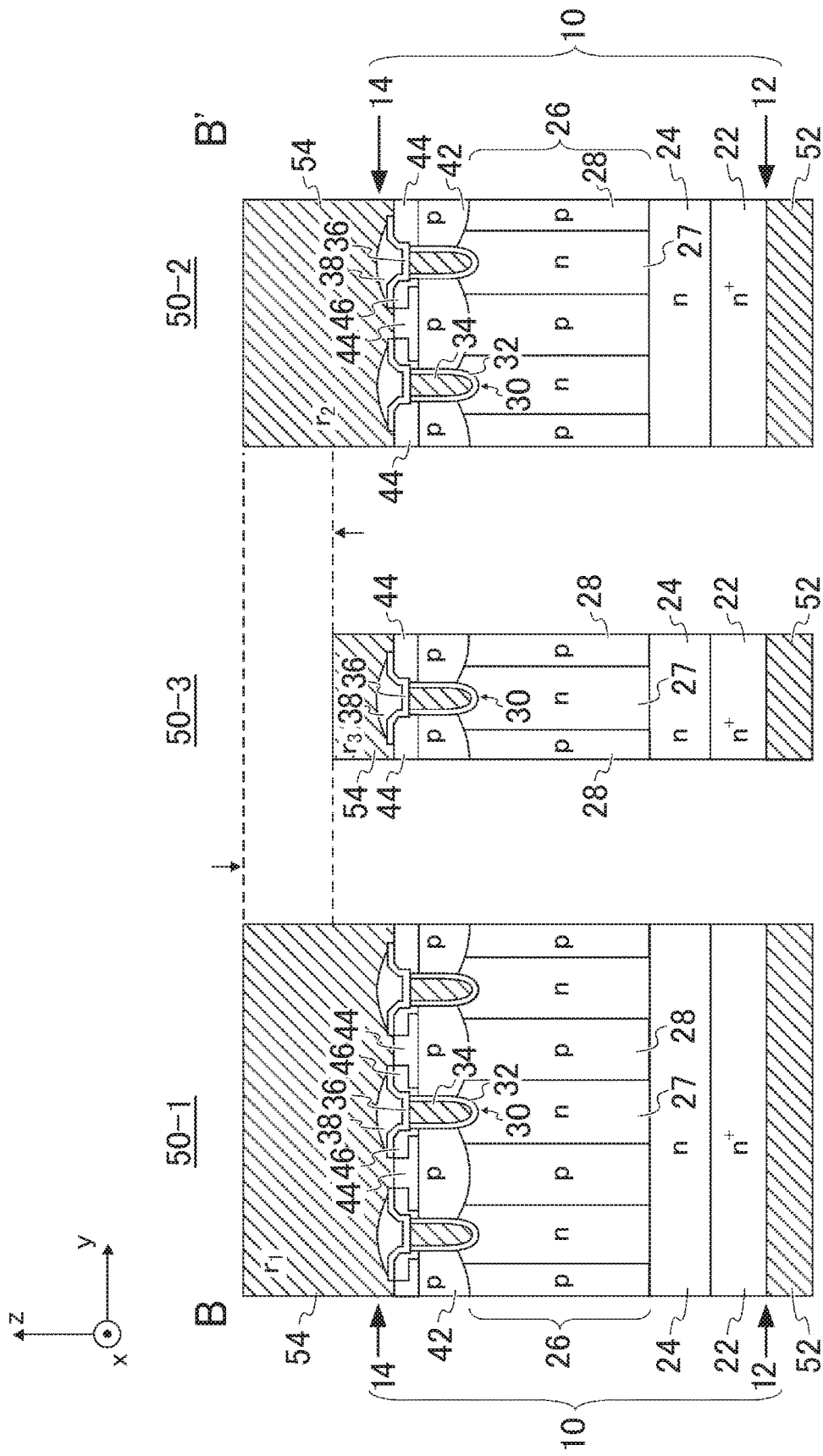
FIG. 7B shows the B-B' cross section from FIG. 6 according to a third modification of the third embodiment.

FIG. 7A shows the B-B' cross section from FIG. 6 according to a second modification of the third embodiment. FIG. 7B shows the B-B' cross section from FIG. 6 according to a third modification of the third embodiment. As shown in FIG. 7A, the thickness of the connection region 50-3 of the source electrode 54 is less than the thickness of the first region 50-1 and less than the thickness of the second region 50-2. As shown in FIG. 7B, the thickness of the connection region 50-3 of the source electrode 54 is less than the thickness of the first region 50-1 and less than the thickness of the second region 50-2, and the thickness of the first region 50-1 is the same as the thickness of the second region 50-2. In this way, the sheet resistance $r_3$ in the connection region 50-3 can be made higher than the sheet resistance $r_2$ in the second region 50-2. Accordingly, the current can more effectively be prevented from flowing from the first region 50-1 to the second region 50-2 through the connection region 50-3.

In another example, the connection region 50-3 and the second region 50-2 of the source electrode 54 have the same thickness, and both may be thinner than the first region 50-1. Furthermore, in the same manner as in the embodiments described above, one or more of the diameter, the material, and the length of each wire and also the sheet resistances of the first region 50-1, the second region 50-2, and the connection region 50-3 may be adjusted. The present example differs from the third embodiment with regard to these points. Other points in the present example may be the same as in the third embodiment. In a case where the ratio between the main current and the sense current can be adjusted without changing the thicknesses of the source electrode 54 in the first region 50-1, the second region 50-2, and the connection region 50-3, the thickness of the source electrode 54 in the first region 50-1, the second region 50-2, and the connection region 50-3 may be the same, in the same manner as in the first embodiment.

Figure 8:
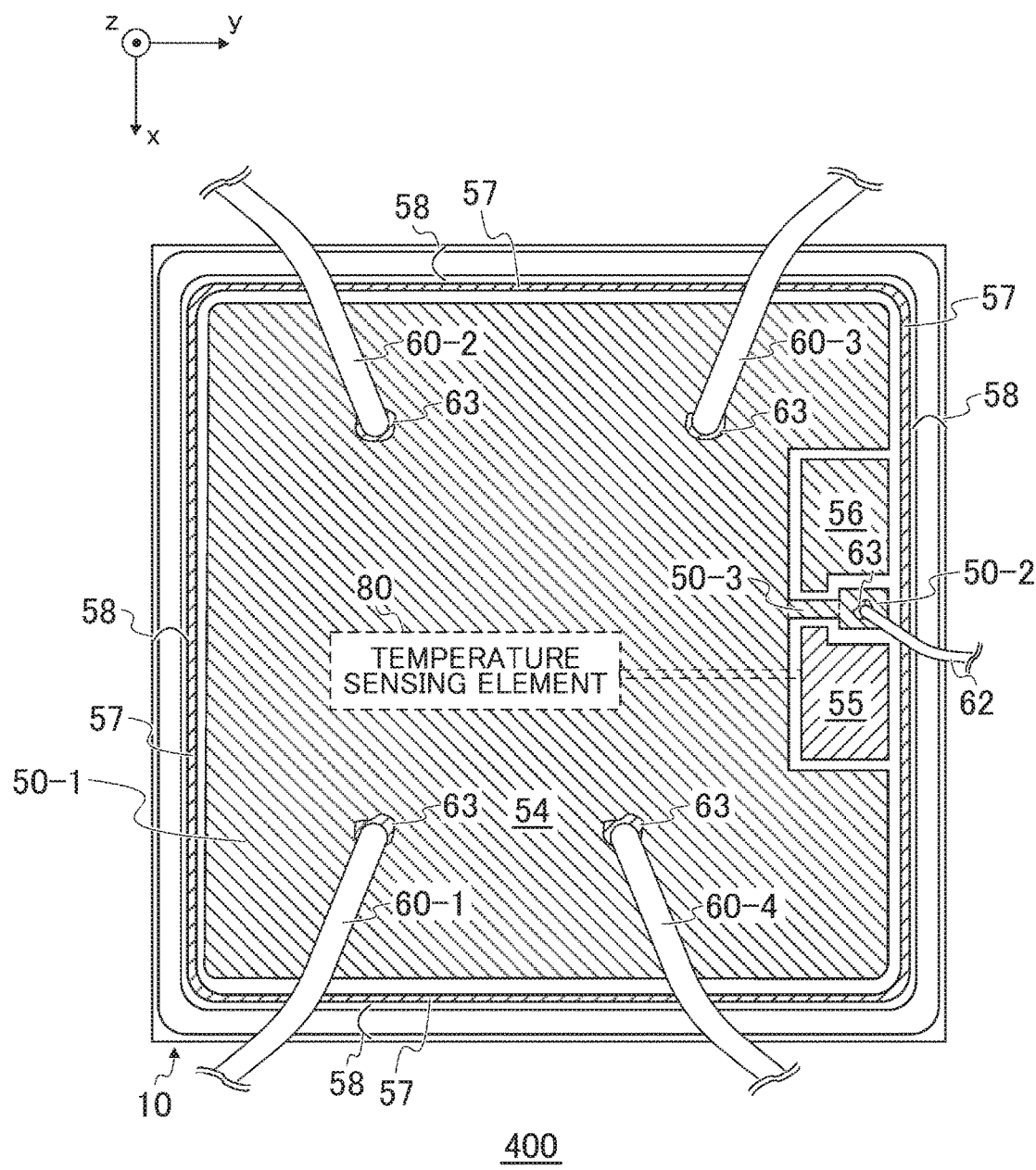
FIG. 8 shows a top surface of a semiconductor device 400 according to a fourth embodiment.

FIG. 8 shows a top surface of a semiconductor device 400 according to a fourth embodiment. The semiconductor device 400 in the present example further includes a temperature sensing element 80 and a temperature sensing electrode pad 55 for the temperature sensing element 80. The temperature sensing element 80 in the present example has a function to measure the temperature of the semiconductor device 400. The temperature sensing element 80 in the present example is positioned substantially in the center of the x-y plane in the semiconductor device 400, which is where the temperature is highest. The temperature sensing electrode pad 55 is positioned on a side of the gate electrode pad 56 opposite that of the connection region 50-3 and the second region 50-2 in a direction parallel to the x direction.

The temperature sensing element 80 may be a pn diode. A prescribed forward current may be made to flow through the pn diode. The prescribed forward current value or voltage value flowing through the temperature sensing element 80 changes according to the temperature of the semiconductor device 400. In the same manner as in the example of FIG. 4, the prescribed forward current or voltage flowing through the temperature sensing element 80 may be input to the control section 98. The control section 98 may determine the temperature of the semiconductor device 400 from the change in the prescribed forward current or voltage.

Along with the temperature change of the semiconductor device 400, the magnitudes of the main current and sense current of the MOSFET 90 can also change. In the MOSFET 90, there is a trend that the main current becomes smaller in accordance with an increase in temperature, even when the gate potential is the same. For example, when the temperature of the semiconductor device 400 is 125 [° C.], the main current is smaller than when the temperature of the semiconductor device 400 is 25 [° C.].

The control section 98 may control the gate potential ($V_G$) applied to the gate electrode 34 of the MOSFET 90 according to the temperature of the semiconductor device 400. Instead of this or in addition to this, the control section 98 may control the magnitude of the forward bias that supplies power to the semiconductor device 400, according to the temperature of the semiconductor device 400.

When the temperature of the semiconductor device 400 is higher than a prescribed temperature, the control section 98 reduces the main current by lowering the gate potential and the forward bias, thereby lowering the temperature of the semiconductor device 400. On the other hand, when the temperature of the semiconductor device 400 is lower than a prescribed temperature, the control section 98 increases the main current by raising the gate potential and the forward bias, thereby raising the temperature of the semiconductor device 400. It is obvious that the present example may be applied to any of the first to third embodiments and the modifications thereof.

Figure 9:
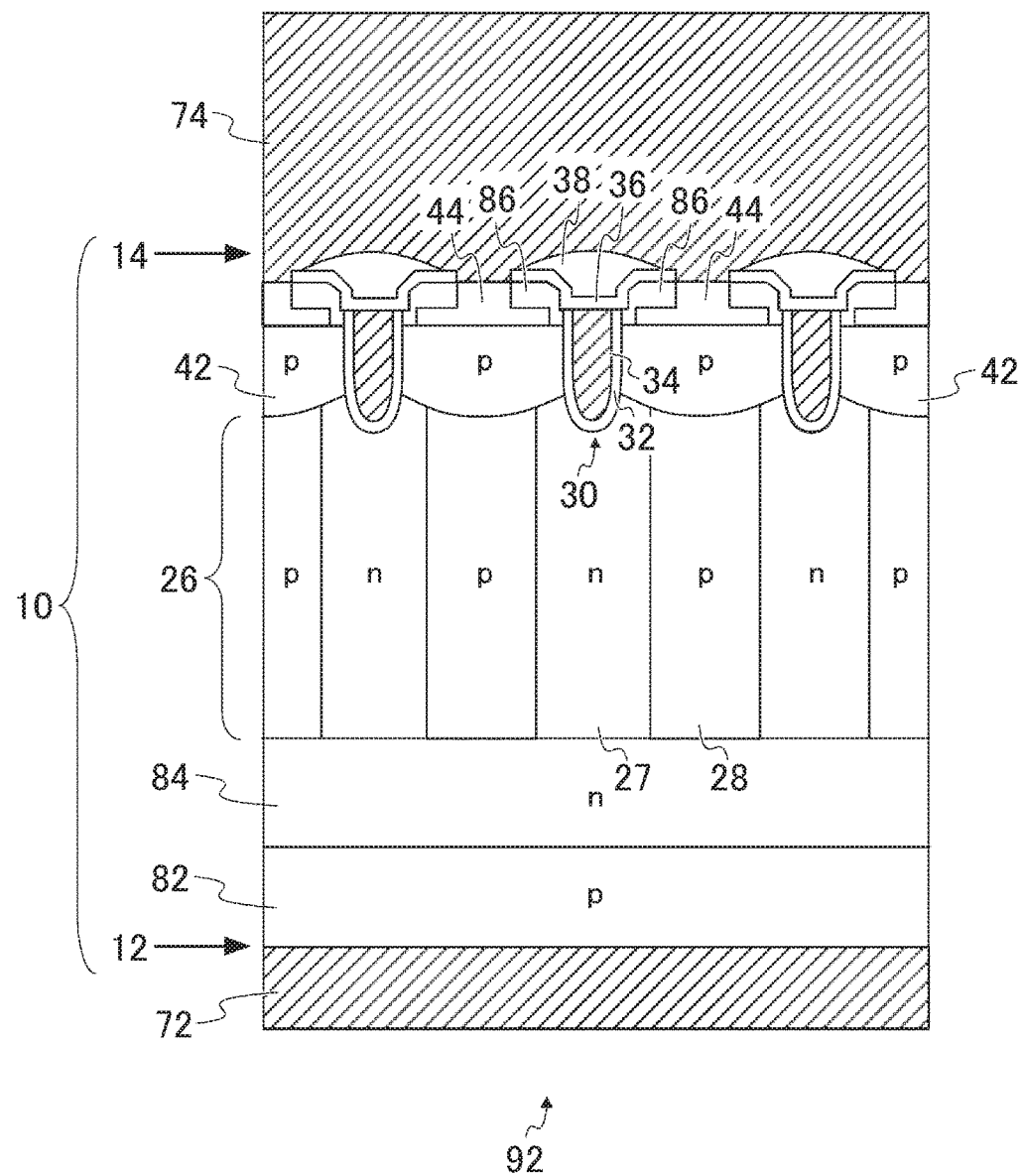
FIG. 9 is a cross-sectional view of a semiconductor device according to a fifth embodiment.

FIG. 9 is a cross-sectional view of a semiconductor device according to a fifth embodiment. Specifically, FIG. 9 shows a cross section of a plurality of unit structures of the IGBT 92. The plurality of unit structures may form one cell, in the same manner as the example of the MOSFET 90. The semiconductor device in the present example includes the IGBT 92 instead of the MOSFET 90. Accordingly, the n+-type layer 22, the n-type layer 24, the source region 46, the drain electrode 52, and the source electrode 54 in the example of the MOSFET 90 are respectively replaced with the a p-type collector layer 82, an n+-type FS (Field Stop)

layer 84, an n⁺-type emitter region 86, a collector electrode 72, and an emitter electrode 74.

It is obvious that the present example may be applied to any of the first to fourth embodiments and the modifications thereof. Accordingly, the diode region 40 in the example shown in FIG. 6 may be a region that does not include and emitter regions 86, instead of a region that does not include and source regions 46.

Figure 10:
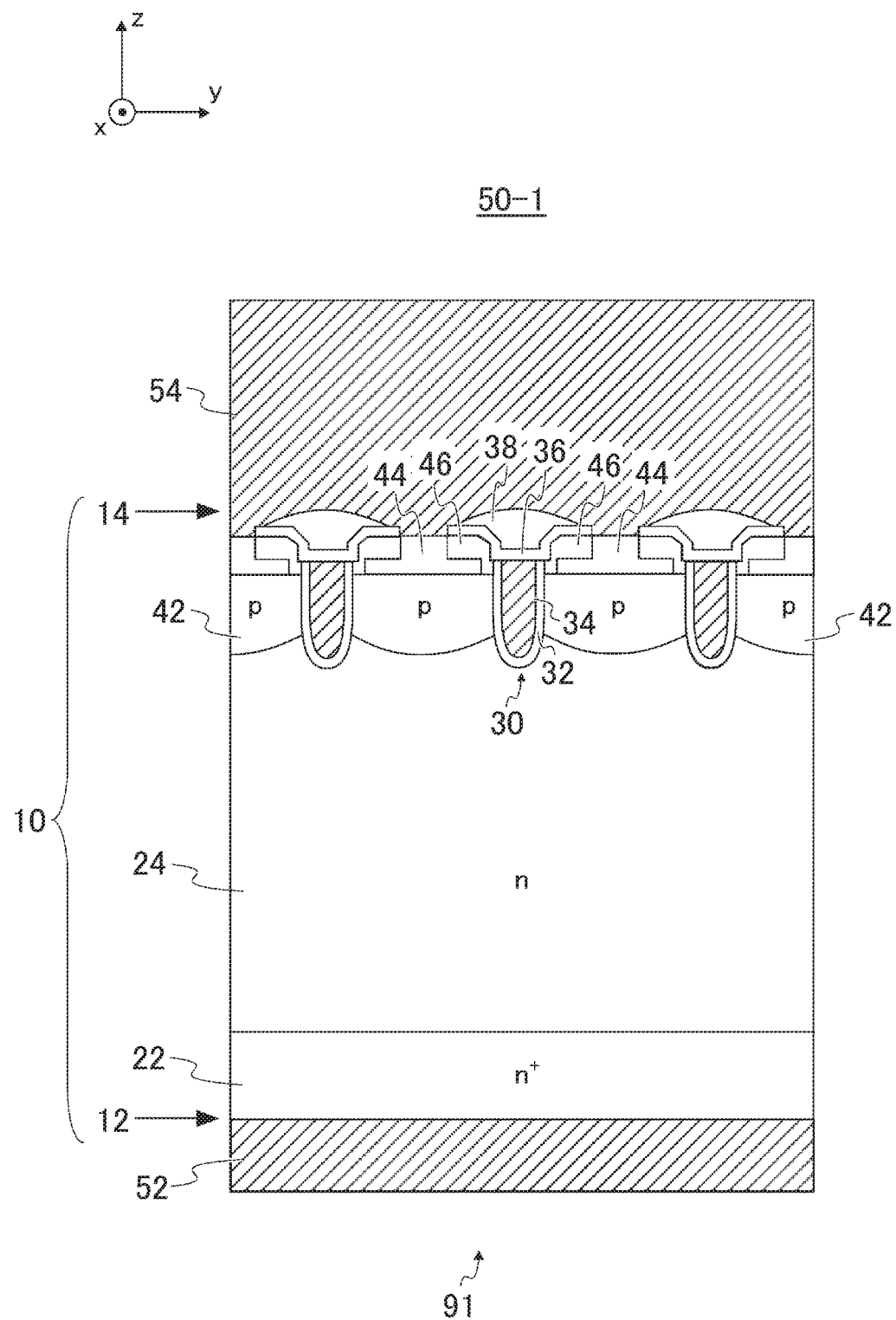
FIG. 10 is a cross-sectional view of a semiconductor device according to a sixth embodiment.

FIG. 10 is a cross-sectional view of a semiconductor device according to a sixth embodiment. FIG. 10 shows a cross section of a plurality of unit structures of a MOSFET 91 that does not include the column layer 26 containing the n-type columns 27 and the p-type columns 28, which is a super junction structure. The plurality of unit structures may form one cell, in the same manner as in the example of the MOSFET 90. The semiconductor device in the present example is formed by the n⁺-type layer 22, the n-type layer 24, the source region 46, the drain electrode 52, the source electrode 54, and the like. It is obvious that the present example may be applied to any of the first to fourth embodiments and the modifications thereof. In particular, the present example is effective for a low breakdown voltage (less than or equal to 200 V) with a low ON resistance. Furthermore, the present example may be employed in the fifth embodiment and the modification thereof described above as the IGBT that does not include the column layer 26 containing the n-type columns 27 and the p-type columns 28 that is a super junction structure. In this case, the n⁺-type layer 22 may be the p-type collector layer 82.

Figure 11:
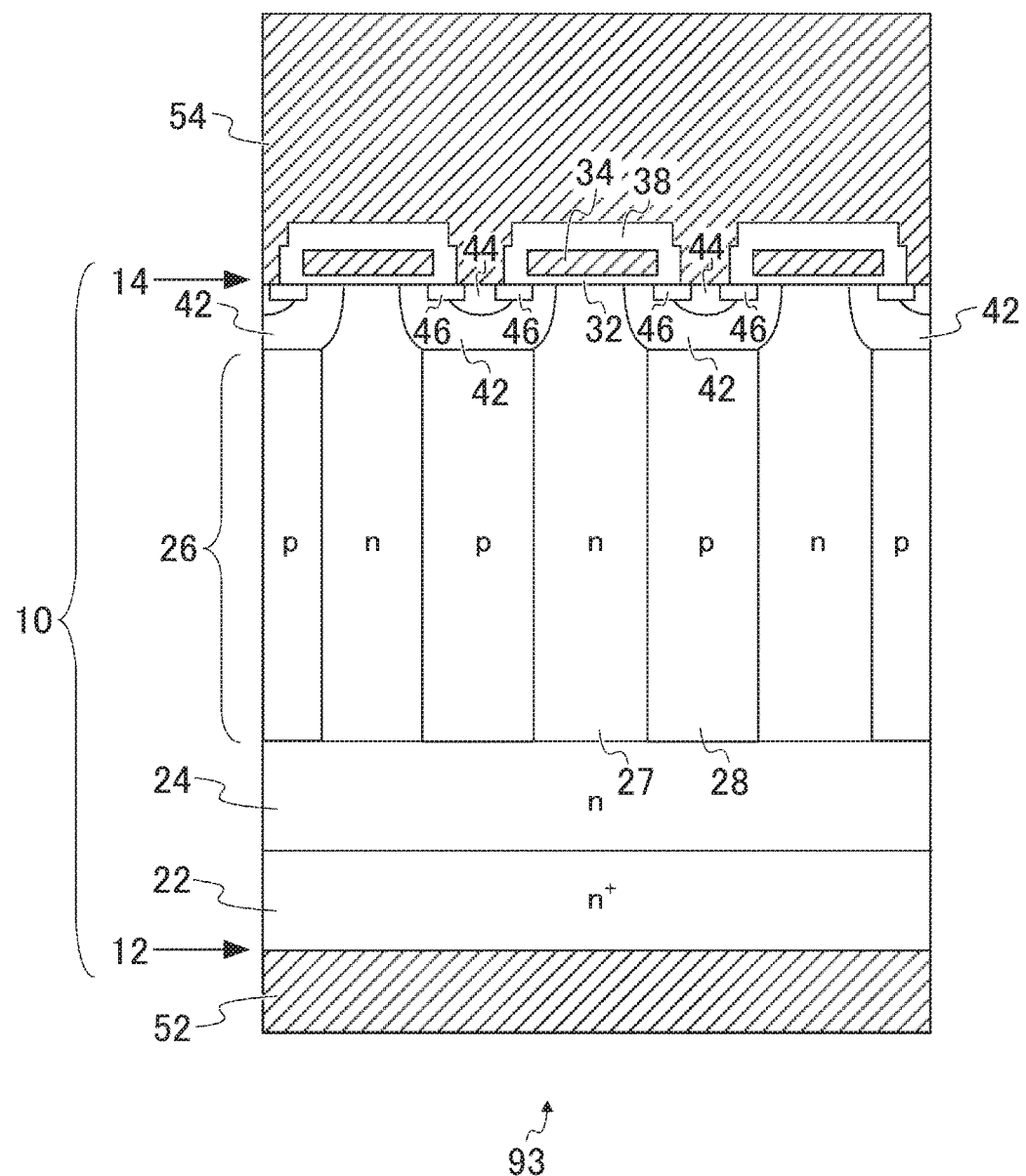
FIG. 11 is a cross-sectional view of a semiconductor device according to a seventh embodiment.

FIG. 11 is a cross-sectional view of a semiconductor device according to a seventh embodiment. FIG. 11 shows a cross section of a plurality of unit structures of a MOSFET 93 that includes a planar gate structure. The plurality of unit structures may form one cell, in the same manner as in the example of the MOSFET 90. The semiconductor device in the present example is formed by the n⁺-type layer 22, the n-type layer 24, the column layer 26, the gate insulating film 32, the gate electrode 34, the second interlayer insulating film 38, the base region 42, the source region 46, the drain electrode 52, the source electrode 54, and the like. It is obvious that the present example may be applied to any of the first to fourth embodiments or the modifications thereof. Furthermore, the present example may be employed in the fifth embodiment and the modification thereof described above as the IGBT. In this case, the n⁺-type layer 22 may be the p-type collector layer 82.

Figure 12:
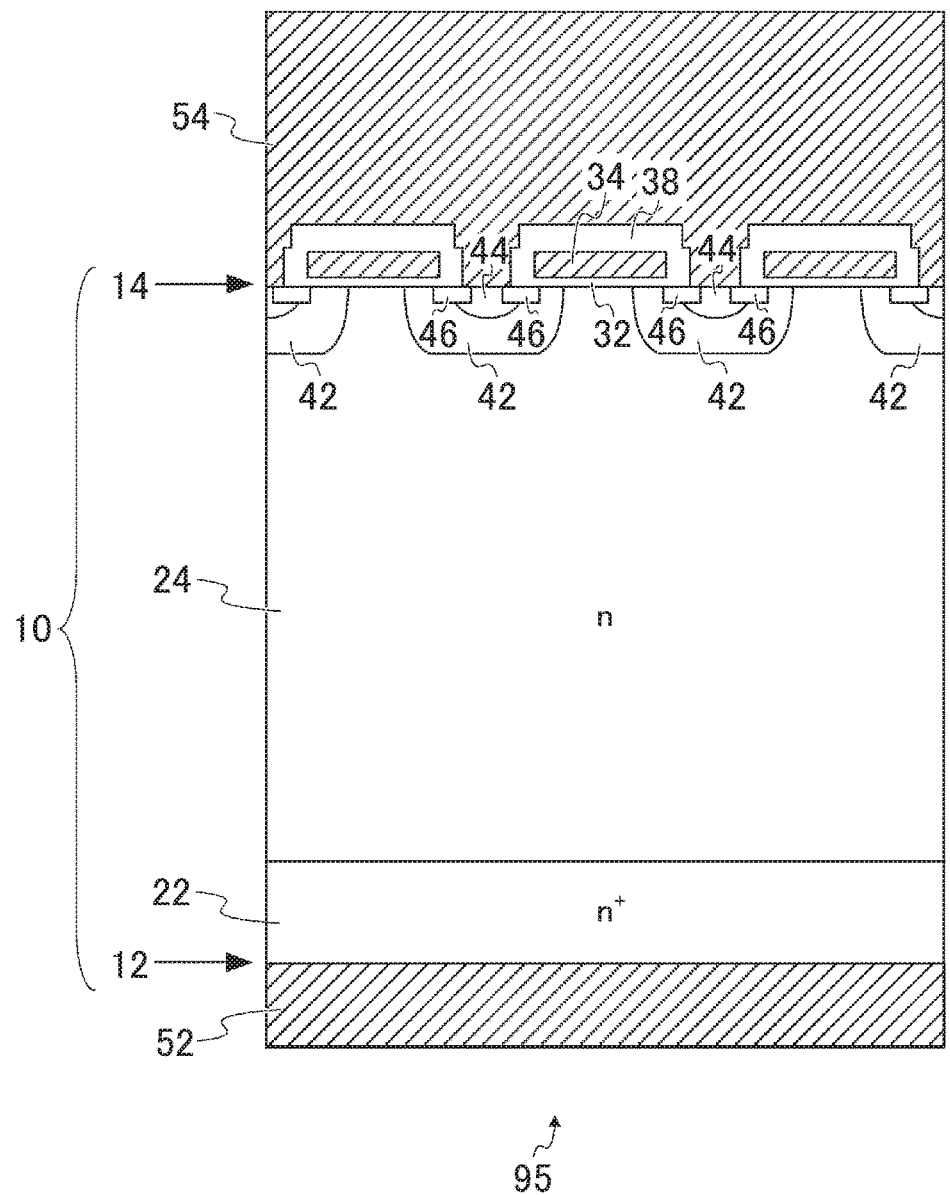
FIG. 12 is a cross-sectional view of a semiconductor device according to an eighth embodiment.

FIG. 12 is a cross-sectional view of a semiconductor device according to an eighth embodiment. FIG. 12 shows a cross section of a plurality of unit structures of a MOSFET 95 that has a planar gate structure and does not include the column layer 26 containing the n-type columns 27 and the p-type columns 28, which is a super junction structure. The semiconductor device in the present example is formed by the n⁺-type layer 22, the n-type layer 24, the gate insulating film 32, the gate electrode 34, the second interlayer insulating film 38, the base region 42, the source region 46, the drain electrode 52, the source electrode 54, and the like. It is obvious that the present example may be applied to any of the first to fourth embodiments and the modifications thereof. In particular, the present example is effective for a low breakdown voltage (less than or equal to 200 V) with a low ON resistance. Furthermore, the preset example may be employed in the fifth embodiment and the modification thereof described above as the IGBT that does not include the column layer 26 containing the n-type columns 27 and the p-type columns 28 that is a super junction structure. In this case, the n⁺-type layer 22 may be the p-type collector layer 82.

The present invention is also effective for a wide bandgap MOSFET made of SiC and GaN or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 12: back surface, 14: front surface, 22: n⁺-type layer, 24: n-type layer, 26: column layer, 27: n-type column, 28: p-type column, 30: trench portion, 32: gate insulating film, 34: gate electrode, 36: first interlayer insulating film, 38: second interlayer insulating film, 40: diode region, 42: base region, 44: contact region, 46: source region, 50-1: first region, 50-2: second region, 50-3: connection region, 52: drain electrode, 54: source electrode, 55: temperature sensing electrode pad, 56: gate electrode pad, 57: gate runner, 58: guard ring, 59: contact portion, 60: source current wire, 62: sense current wire, 63: solder, 72: collector electrode, 74: emitter electrode, 80: temperature sensing element, 82: collector layer, 84: FS layer, 86: emitter region, 90: MOSFET, 91: MOSFET, 92: IGBT, 93: MOSFET, 94: current detecting section, 95: MOSFET, 98: control section, 100: semiconductor device, 300: semiconductor device, 400: semiconductor device

What is claimed is:

1. A semiconductor device comprising:
a semiconductor substrate;
a front surface electrode provided above the semiconductor substrate;
a first wire for a first terminal connected to the front surface electrode; and
a second wire for current sensing connected to the front surface electrode, wherein
a resistance of a path through which current flows through the second wire is higher than a resistance of a path through which the current flows through the first wire.

2. The semiconductor device according to claim 1, wherein
a diameter of the first wire is greater than a diameter of the second wire.

3. The semiconductor device according to claim 1, wherein
a resistance per unit length of the first wire is lower than a resistance per unit length of the second wire.

4. The semiconductor device according to claim 1, wherein a first region of the front surface electrode connected to the first wire has a greater area than a second region of the front surface electrode connected to the second wire.

5. The semiconductor device according to claim 1, wherein
a first region of the front surface electrode connected to the first wire includes a different material than a second region of the front surface electrode connected to the second wire.

6. The semiconductor device according to claim 1, wherein
a thickness of a second region of the front surface electrode connected to the second wire is less than or equal to a thickness of a first region of the front surface electrode connected to the first wire.

7. The semiconductor device according to claim 1, wherein
a thickness of a second region of the front surface electrode connected to the second wire is less than a thickness of a first region of the front surface electrode connected to the first wire.

8. The semiconductor device according to claim 1, wherein
the front surface electrode includes a connection region that connects, in a first direction, a first region of the front surface electrode connected to the first wire and a second region of the front surface electrode connected to the second wire, and
a length of the connection region in a second direction orthogonal to the first direction is less than a length of the second region in the second direction.

9. The semiconductor device according to claim 8, further comprising:
a gate electrode pad provided at a position differing from positions of the second region and the connection region in a direction parallel to the second direction and connected to a gate electrode of the semiconductor device.

10. The semiconductor device according to claim 9, further comprising:
a temperature sensing electrode pad provided on an opposite side of the connection region and the second region from the gate electrode pad in the direction parallel to the second direction and used by a temperature sensing element for measuring temperature of the semiconductor device.

11. The semiconductor device according to claim 8, wherein
a resistance of the connection region is greater than or equal to 10 times an ON resistance of the semiconductor device.

12. The semiconductor device according to claim 8, wherein
the semiconductor substrate includes, below the connection region, a diode region that does not have one of a source region and an emitter region that are regions having low resistance for electrons.

13. The semiconductor device according to claim 8, wherein
a thickness of the connection region of the front surface electrode is less than a thickness of the first region and less than a thickness of the second region.

* * * * *